United States Patent [19]
Shoji

[11] Patent Number: 5,964,352
[45] Date of Patent: Oct. 12, 1999

[54] CARRIER BAND OF ELECTRONIC PARTS

[75] Inventor: Ritsue Shoji, Ibaragi, Japan

[73] Assignee: Nissho Corporation, Osaka, Japan

[21] Appl. No.: 09/048,408

[22] Filed: Mar. 26, 1998

[51] Int. Cl.⁶ .................................................. B65D 85/00
[52] U.S. Cl. ......................... 206/713; 206/722; 206/460
[58] Field of Search .................................. 206/714, 713, 206/716, 717, 722, 726, 460, 345, 813, 486

[56] References Cited

U.S. PATENT DOCUMENTS

| | | | |
|---|---|---|---|
| 3,103,061 | 9/1963 | Fonoroff et al. | 206/726 |
| 4,966,282 | 10/1990 | Kawanishi et al. | 206/330 |
| 5,224,597 | 7/1993 | Hauchard | 206/345 |
| 5,524,765 | 6/1996 | Gutentag | 206/716 |
| 5,747,139 | 5/1998 | Schenz | 206/717 |
| 5,765,692 | 6/1998 | Schenz | 206/713 |

FOREIGN PATENT DOCUMENTS

| | | |
|---|---|---|
| 58-53899 | 3/1983 | Japan . |
| 61-119957 | 7/1986 | Japan . |
| 61-217363 | 9/1986 | Japan . |
| 02109815 | 4/1990 | Japan . |
| 2-90268 | 7/1990 | Japan . |
| 04102518 | 4/1992 | Japan . |
| 6-219412 | 8/1994 | Japan . |

OTHER PUBLICATIONS

Japanese Patent Office, "Notice of Rejection Reasons" as to corresponding Japanese Patent Application No. 08–161168, (Oct. 6, 1998).

*Primary Examiner*—Paul T. Sewell
*Assistant Examiner*—Nhan T. Lam

[57] ABSTRACT

The invention provides a carrier band of electronic parts, comprising: a band-type tape band 12, which has sprocket holes 13 and holes 14 at regular intervals; a one-side sticking tape 15, which is affixed to a back side of the tape band 12, wherein a sticking face of the tape is exposed from the holes 14 such that electronic parts A can be stuck at the sticking face of the tape and rolled up to a reel; and projecting portions 16, 16, which are formed in both side edges of a tape width direction of the holes 13 of the tape band 12 such that a distance between opposing pointed ends can be narrower than a width of the sticking tape 15, wherein both sides of the sticking tape 15 pushed up to an upper side of the holes 14 are supported by the projecting portions 16, 16.

13 Claims, 5 Drawing Sheets

(A)

(B)

(C)

CARRIER BAND OF ELECTRONIC PARTS

BACKGROUND OF THE INVENTION

A. Technical Field

The present invention relates to a carrier band of a carrier tape system in which electronic parts are stuck to a tape band and rolled up to a reel.

B. Background Art

As the electronic industry develops and the automation progresses, the automatic mounting of the electronic parts becomes strongly required. And, as carrier bands of electronic parts, those of a carrier taping system increase in which high-speeding and making long are possible. Among taping systems, as the environmental preservation spreads globally, a sticking system becomes well evaluated in which decreasing of the public nuisance is possible.

Classifying roughly, as carrier systems of conventional carrier bands, an emboss system, a convexity system and a sticking tape system are used.

As shown in FIG. 5 (A), in the emboss system, a storing box 2 is emboss-formed to a tape band 1 and stores an electronic part A inside and is covered with a cover tape 3. In this system, sealing between the tape band 1 and the cover tape 3 is difficult. If the sealing is weak, the electronic part A springs out. If the sealing is strong, the cover tape 3 is not peeled off and is broken at the time of mounting. And, this system is various and lacks an adaptability. Also, this system needs a metal mold which increases a cost.

As shown in FIGS. 5 (B1) and (B2), in the convexity system, convexities 4 are formed on the tape band 1 at regular intervals and the electronic part A is fixed on the convexity with an adhesive. Therefore, when the electronic parts A are taken out, it is necessary to push up a pin 5 from the under side of the convexity 4 and thrust the electronic part A with the pin 5. And, in case of the thin electronic part, there is a possibility that the electronic part might be broken due to a shock of pushing up the pin 5.

As shown in FIGS. 5 (C1), (C2) and (D), in the sticking system, the tape band 1 has holes 6 at regular intervals, and a sticking face of a sticking tape 7 affixed to the back side of the tape band 1 is exposed to the holes 6, and the electronic parts A are stuck to this sticking face. This system is free-size style and has an advantage that many electronic parts can be taped and is superior to said emboss system and said convexity system.

By the way, in the sticking carrier tape system, the sticking tape is affixed to the back side of the tape board which has the holes at regular intervals as the sticking face is exposed to the holes, and is rolled up to a reel to complete the sticking carrier tape. Then, the sticking carrier tape is sent to a IC maker. In the IC maker, the carrier tape is rolled back and the electronic parts are stuck on the holes with a taping machine and rolled up to a reel and sent to a mounting user.

In the mounting user, the carrier tape with the electronic parts is rolled back and the electronic parts are absorbed with a mounting machine simultaneously with peeling off the stick tape from the back side of the tape band. The absorbed electronic parts are mounted on printed-circuit boards. Thus, the role of carrier tape is finished.

In most of sticking carrier system, the width of the holes is wider than the sticking tape and the sticking tape is affixed to the tape band so that there are openings at both sides of the holes. Other way of sticking carrier is seldom used.

The reason of making above openings is referred below. As shown in FIGS. 5 (C2) and (D), in the electronic part A, reed portions B hang downward from the body so that reeds do not rise at the time of soldering. The distance between the bottom of the body and a pointed end of the reed portion B is called stand-off S. Therefore, the bottom of the body is higher than the tape band 1 by stand-off S. It is necessary that the sticking tape 7 is stuck to the electronic part A as the sticking tape 7 is pushed up greatly from the lower side of the tape band 1 to the bottom of the body of the electronic part A and is extended. As shown in FIG. 6 (A) and (C), the openings 18 are made on both sides of the holes so that the sticking tape 7 is ready to extend.

There are problems listed below in above-mentioned carrier tape which has the openings 18 on both sides of the holes.

(1) In case of the electronic part A (IC) smaller than the hole 6, problems happen when the sticking tape 7 is peeled off from the back side at the time of peeling off of the part as the hole 6 is larger than the width of the sticking tape 7. When the part is larger than the hole, the tape supports the part. However, when the part is smaller than the hole, as shown in FIG. 6 (C), only the reed portions of the electronic part mount on the tape band. Therefore, the reed sometimes bends at the time of peeling off of the part as the reed portions do not have enough force to support the part. Furthermore, as shown in FIG. 6 (D), the part is not peeled off and thrust through with being stuck to the sticking tape. Also, when the part is peeled off from the tape band, the part is peeled off from the sticking tape by a peeling exfoliation. If the both sides of the part are openings, there is no position to support the part. Therefore, the part sometimes slip by the side force at the time of peeling off of the sticking tape. As mentioned above, there are cases in which the small parts can not be applied to by the carrier tape which has the openings 18 on both sides of the holes.

(2) The carrier tape is manufactured by affixing the sticking tape to the back side of the tape band. Even if the sticking tape is affixed to the center of the tape band, the sticking tape rises at first and becomes to attach with time as an exfoliation agent for peeling off is applied on the back side of the tape band. And, the sticking tape sometimes slip from the center as there is no support of the sticking tape at the time of rolling up to a reel. If the sticking tape meanders to one side of the holes, the openings are covered and the sticking tape does not rise. In that case, as the sticking area with the electronic parts decreases, the parts are not sometimes stuck and fall off to be a cause of troubles.

(3) In the carrier sticking tape, the adhesive is applied to a crape base considering an extension. When the part is stuck to the sticking tape, the sticking tape is pushed up greatly from a horizontal condition as FIG. 5 (C1) to a condition as FIG. 5 (C2) and is stuck to the part. Therefore, a great stress is applied to the sticking tape and the adhesive as well as the tape is extended and is thinned and the sticking force becomes weak. Furthermore, if the base made of Japanese paper is dried at the greatly extended condition after a moisture absorption, a strong shrinking force is applied to the base as "shoji" paper. And, if the shrinking force becomes stronger than the sticking force to the part, the part falls off and this becomes a big trouble. As mentioned above, there are cases in which the parts having a large stand-off can not be applied to by the carrier tape which has the openings 18 on both sides of the holes.

Also, when the adhesive is extended, the adhesive is apt to be influenced by the oxygen and the water in the air and changes in quality and returns to be gummous. Therefore, when the part is peeled off from the carrier tape at the time of mounting, the sticking tape becomes a gummous roping condition. As a result, the parts are not peeled off from the tape and the parts can not be absorbed. This big trouble has not been yet solved. Above problem can not be solved by the current system of forming the openings and pushing up the sticking tape and extending it greatly and sticking.

Therefore, it is planned to manufacture a carrier tape in which the sticking tape is pushed up beforehand to the upper side of the holes of the tape board having the holes. However, the carrier tape is rolled up to the reel after affixing the sticking tape and the board. Then, the carrier tape is sent to the IC maker. Therefore, if the sticking tape is only pushed up, the sticking tape is pressed down as a rolling pressure is applied for rolling up of the reel and as the pushed up sticking tape is not supported. And, in that case, the sticking tape is pushed back and is crushed out of shape and sticking faces are mutually stuck. Therefore, such a carrier tape is unable to be used and can not be put to practical use.

(4) A one-side sticking tape is rolled on the back side of the base with an exfoliation treatment. The tape is properly weighed not to fall loose. Therefore, the exfoliation force is necessary to roll back. However, the sticking tape is placed on the tape base and the tape base is rolled up to the reel at high speed at the time of manufacturing the carrier tape. Therefore, the sticking tape is apt to be extended according to the weight of the exfoliation force of the sticking tape. And, a big rolling pressure is applied to the direction of rolling up as a back tension is applied. Furthermore, the sticking face exposed from the holes is pressed down by the pressure and the sticking layer thins and the sticking force becomes weak according to be near to the center side. This becomes a cause of troubles.

SUMMARY OF THE INVENTION

A. OBJECTS OF THE INVENTION

An object of the present invention is to provide a carrier band of electronic parts which can solve above many problems in the conventional sticking carrier tape system.

B. DISCLOSURE OF THE INVENTION

To solve the above problems, the invention according to claim 1 is a carrier band of electronic parts, comprising:

a band-type tape band, which has sprocket holes and holes at regular intervals;

a one-side sticking tape, which is affixed to a back side of the tape band, wherein a sticking face of the tape is exposed from the holes such that electronic parts can be stuck at the sticking face of the tape and rolled up to a reel; and projecting portions, which are formed in both side edges of a tape width direction of the holes of the tape band such that a distance between opposing pointed ends can be narrower than a width of the sticking tape, wherein both sides of the sticking tape pushed up to an upper side of the holes are supported by the projecting portions.

The sticking tape can be pushed up by a jig to support the sticking tape by the projecting portions formed on the both sides of the holes as project toward inside. The projecting portions can be in arbitrary forms according to the size of the holes. The forms and the projecting quantity of the projecting portions are such that the sticking tape do not fall into the holes when rolled up to a reel and that the projecting portions do not interfere when the electronic parts are stuck and when the sticking tape is peeled off at the time of mounting.

The invention according to claim 2 is a carrier band of electronic parts, comprising:

a band-type tape band, which has sprocket holes and holes at regular interval, wherein the holes are trapezoid-type for multi-pin parts of which a reed portion of IC is thin and weak and for parts of which a reed portion hangs down greatly;

a one-side sticking tape, which is affixed to a back side of the tape band, wherein a sticking face of the tape is exposed from the holes such that electronic parts can be stuck at the sticking face of the tape and rolled up to a reel; and projecting portions, which are formed in both side edges of a tape width direction of the holes of the tape band such that a distance between opposing pointed ends can be narrower than a width of the sticking tape, wherein both sides of the sticking tape pushed up to an upper side of the holes are supported by the projecting portions.

These and other objects and the advantages of the present invention will be more fully apparent from the following detailed disclosure.

BRIEF DESCRIPTION OF THE DRAWINGS

FIG. 3 (B) is a longitudinal section view of a carrier band formed trapezoid-type projecting portions on both sides of holes made at regular intervals. FIG. 3 (C) is a top view of FIG. 3 (B).

FIG. 4 (B) is a longitudinal section view of a principal part of a carrier band to which electronic parts having a large stand-off are stuck. FIG. 4 (C) is a top view showing a modification of trapezoid-type portions. FIG. 4 (D) is a perspective view of FIG. 3 (B).

FIGS. 5 (B1) and (B2) are sectional views showing a convexity system of usual carrier band. FIGS. 5 (C1) and (C2) are sectional views showing a sticking system of usual carrier band. FIG. 5 (D) is a sectional view showing a stand-off.

FIG. 6 (B) is a side view of FIG. 6 (A). FIG. 6 (C) is a top view showing a usual hole mounted a electronic part. FIG. 6 (D) is a side view of FIG. 6 (A) at the time of peeling off.

DETAILED DESCRIPTION OF THE INVENTION

Figure 1:
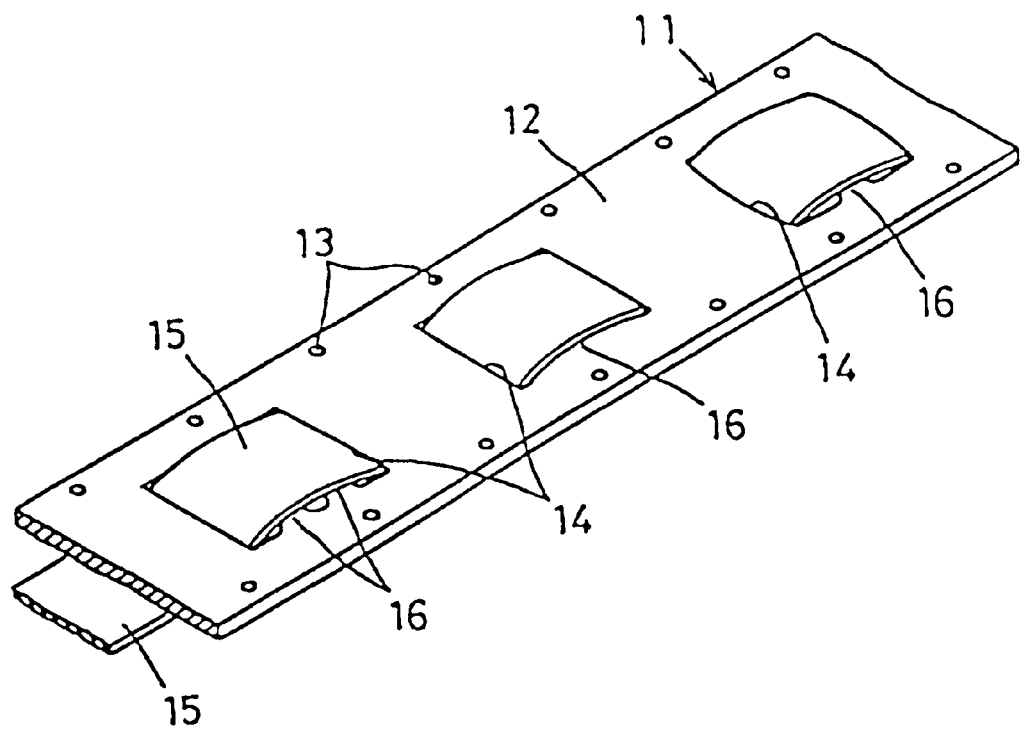
FIG. 1 is a perspective view of a carrier band according to the present invention.
Figure 2:
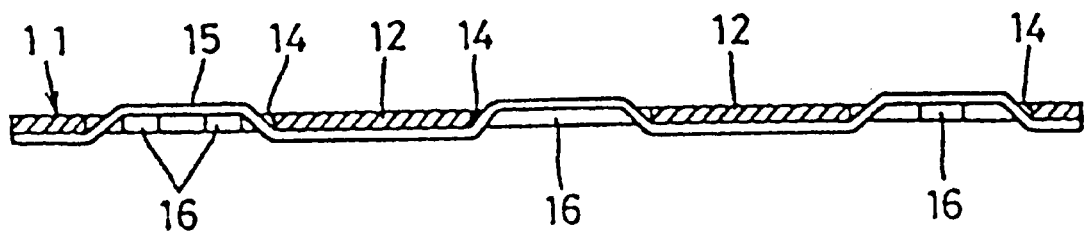
FIG. 2 is a longitudinal section view of FIG. 1.

The detailed description of the invention is explained below referring to FIGS. 1–4.

As shown in figures, a carrier band 11 of a carrier tape system has sprocket holes 13 of both sides and holes 14 of electronic parts respectively at regular intervals in the lengthwise direction on a band-type tape 12. A sticking tape 15 is stuck to the back side of the tape band 12. A sticking face is exposed from the holes. The sticking tape is rolled up to a reel.

Said holes 14 are formed a little wider than the width of the sticking tape 15. Projecting portions 16, 16 are formed as project toward inside at the both side edges of the holes 14. The both projecting portions 16, 16 are formed as the distance between the opposing pointed ends is narrower than the width of the sticking tape 15. When the sticking tape 15 is pushed up to the upper side of the holes 14, the projecting portions 16, 16 support the both lower sides of the sticking tape 15 and prevent the occurrence of openings at the both sides of the holes 14.

Figure 3:
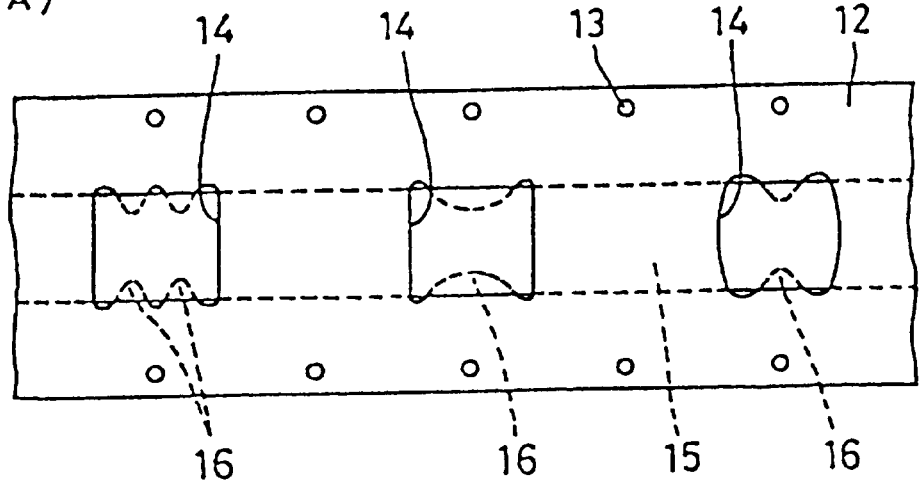
FIG. 3 (A) is a top view of a tape band showing different examples of projecting portions formed on both sides of holes.
Figure 3:
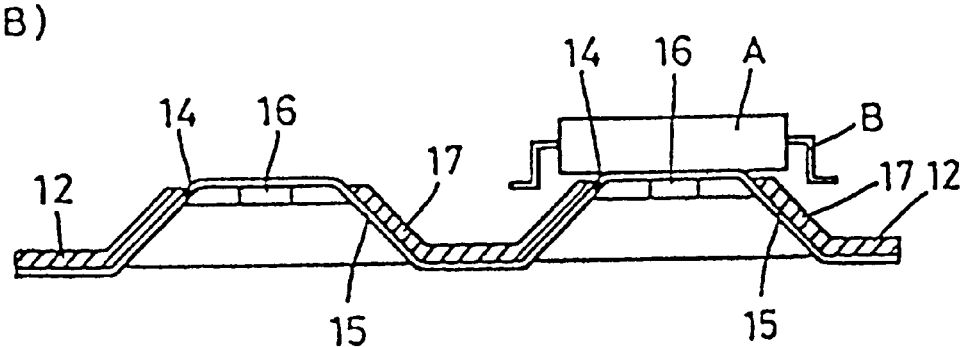
Figure 3:
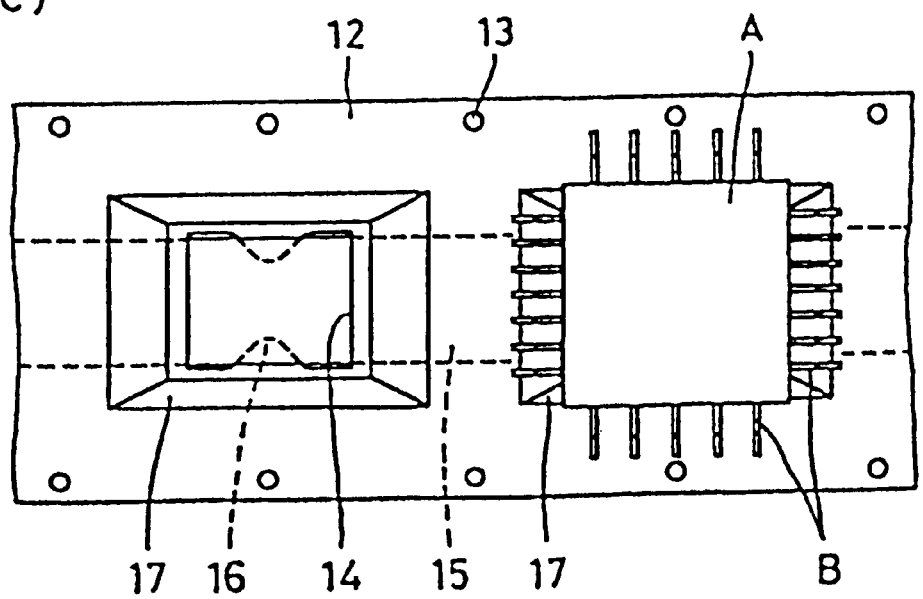

FIG. 3 (A) shows different examples of above projecting portions 16, 16. The projecting portions 16, 16 are formed in arbitrary styles such as nail-type and half-circle-type according to the size of the holes 14. When the sticking tape is affixed to the tape band 12, the projecting portions 16, 16 are pushed up upward by a jig with the sticking tape 15 and the projecting portions 16, 16 bend upward and can pass the sticking tape 15 upward. The plane forms and the projecting quantity of the projecting portions 16, 16 are established such that the projecting portions 16, 16 do not interfere when the electronic parts A are stuck and the sticking tape 15 is peeled off. When the sticking tape 15 is rolled up to the reel, the projecting portions 16, 16 are pushed down from upward to become plane and the projecting portions 16, 16 support the both sides of the sticking tape 15 and prevent falling of the sticking tape 15.

In FIGS. 3 (B) and (C), trapezoid portions 17 having the holes 14 are formed on the tape band 12 at regular intervals, the projecting portions 16, 16 are formed at the both side edges of the holes 14 of the trapezoid portions 17. The distance between the pointed ends of the projecting portions 16, 16 is established as narrower than the width of the sticking tape 15. Said projecting portions 16, 16 support the both sides of the sticking tape 15 pushed up to the upper side of the holes 14.

Figure 4:
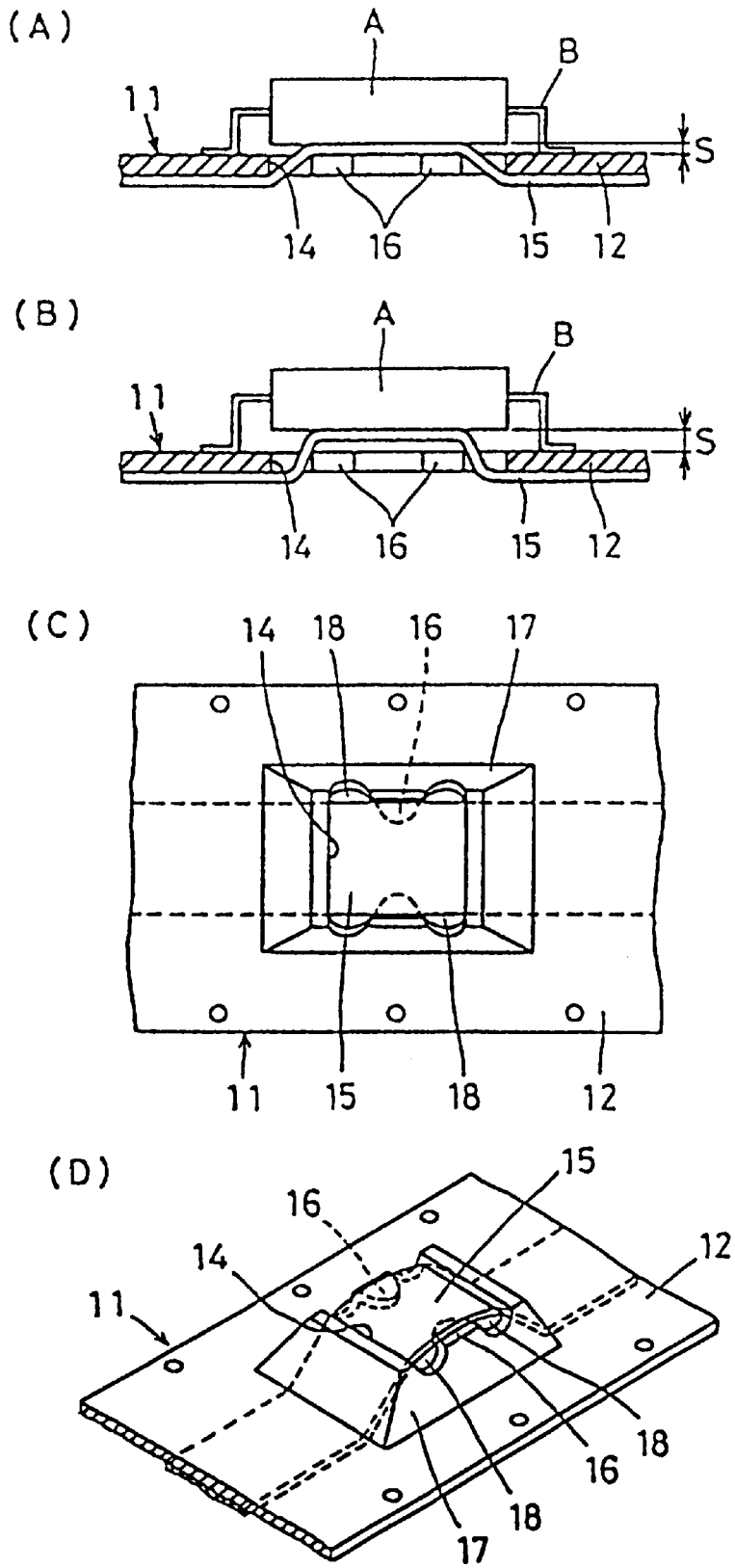
FIG. 4 (A) is a longitudinal section view of a principal part of a carrier band to which electronic parts having a small stand-off are stuck.
Figure 5:
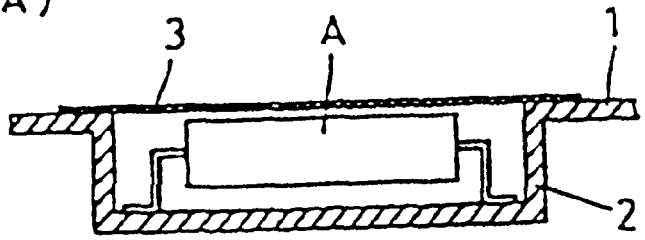
FIG. 5 (A) is a sectional view showing an emboss system of usual carrier band.
Figure 5:
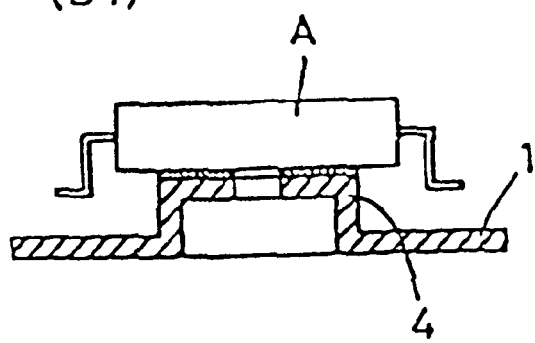
Figure 5:
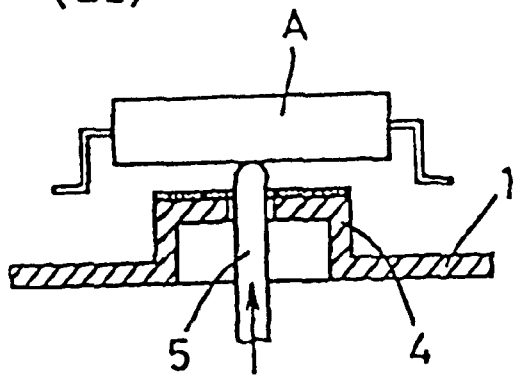
Figure 5:
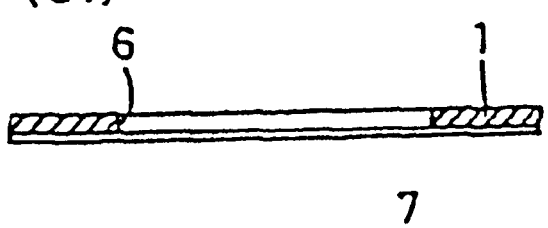
Figure 5:
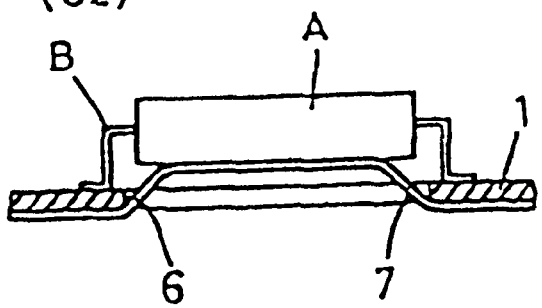
Figure 5:
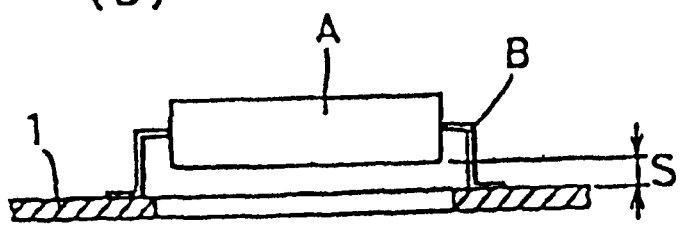
Figure 6:
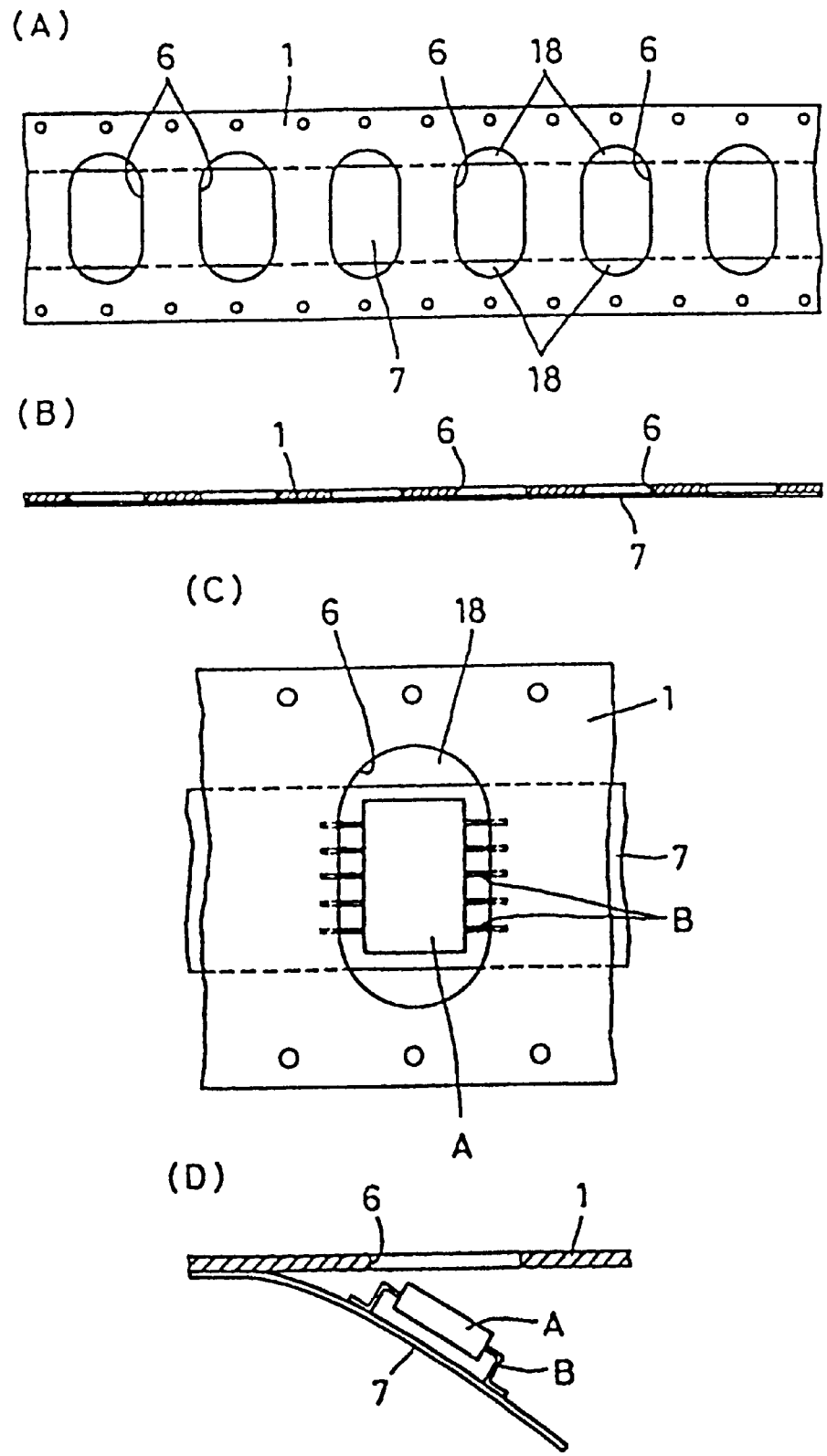
FIG. 6 (A) is a top view of a usual carrier tape having openings on both sides of holes.

Also, FIGS. 4 (C) and (D) shows a modification example of the trapezoid portion 17. In this example, scooped portions are formed which is a little scooped out downward at the both side edges.

This enables the taping of the smaller part which is impossible in thrusting-up-type as the width of trapezoid cam be made narrower.

The carrier band of the present invention has above constitution and can be taped by sticking the body of the electronic part to the sticking face of the sticking tape 15 pushed up on the projecting portions 16, 16 at portions of the each hole of the tape band. FIG. 4 (A) shows a sticking condition when a stand-off S of the electronic part is small and FIG. 4 (B) shows a sticking condition when a stand-off S is large. The sticking tape 15 is beforehand pushed up to the upper side of the projecting portions 16, 16. Therefore, if the stand-off S is large, the distance of pushing up the sticking tape is much shorter than usual and the extended rate of the sticking tape 15 is small. As a result, the problems by being extended the sticking tape are solved.

That is to say, the exfoliation due to the shrinkage of the sticking tape which occurs due to great extension of the sticking tape 15, as well as the deterioration of weakening of the sticking force due to extending and thinning of the adhesive, can be prevented.

Also, as the hole does not have openings at its both sides, the electronic parts A can be supported strongly at the both side portions of the holes 14 of the tape band 12. As a result, when the electronic parts A are peeled off from the sticking tape 15 at the time of mounting, the electronic parts A neither thrust through the holes nor slip to a side.

As above mentioned, the present invention has above constitution, there are effects as listed below.

(a) The sticking tape is pushed up on the holes with a jig at the time of manufacturing the carrier tape. Therefore, though a manufacturing speed is slow, there is no rolling pressure as a back tension is not applied at the time of rolling back the reel. And, a lowering of the sticking force does not occur as the sticking tape is not pushed strongly by the rolling pressure.

(b) As the sticking tape is established upper than the hole, the sticking tape never slip right and left and the meandering trouble of the sticking tape is prevented.

(c) As the sticking tape is established upper than the board, the sticking tape is never pushed up forcibly from the lower side of the board as conventional. And, the deterioration of the sticking tape due to extending greatly the sticking tape, and the trouble of falling off by the shrinkage are prevented. Furthermore, the electronic part, which has a large stand-off and conventionally can not be applied, can be taped.

(d) As the hole has no opening, the both edge portions of the holes support the part strongly. Therefore, when the electronic parts A are peeled off from the sticking tape 15 at the time of mounting, the electronic parts neither thrust through the holes nor slip to a side.

As above mentioned, according to the present invention, many problems of the conventional sticking carrier tape are solved and the reliance is greatly increased. The present invention can be applied to the electronic parts which are conventionally out of use. The rationalization of the taping process and lowering of the cost are possible by a free-size nature of the sticking system. And, the amount of the industrial waste and the refuse are greatly decreased in comparison with other carrier systems by non-pollution nature which is the best merit. Therefore, according to the present invention, a great effect is taken to the manufacturing trade of an electronic apparatus such as a computer and a carrier tape system is obtained which can contribute greatly to the global preservation of the environment.

In other words, the present carrier 11 for electronic parts A includes a) the band 12 having a length and a length direction, a width and a width direction, and a thickness and a thickness direction, b) a pair of faces running the length of the band 12, c) a pair of outer edges running the length of the band 12, d) a set of openings 14 running in the length direction and being spaced from the outer edges of the band 12, with each of the openings 14 being spaced from each other, e) a plurality of pairs of first and second inner edges formed by the openings 14, with each of the first inner edges being paired with one of the second inner edges of the band 12, with the first and second inner edges of each of the pairs being across from each other in the width direction of the band 12.

The present carrier further includes the tape 15 extending in the length direction of the band. The tape 15 includes a) a length and a length direction, a width and a width direction, and a thickness and a thickness direction, b) a pair of outer edges running the length of the tape 15, with one of the outer edges of the tape 15 confronting the first inner edges of the band 12 and with the other of the outer edges of the tape 15 confronting the second inner edges of the band 12, and c) a pair of opposing faces, with one of the faces comprising an adhesive face, with some sections of the adhesive face adhering to one of the faces of the band 12, with other sections of the adhesive face being exposed by the openings 14 of the band 12 such that electronic parts A can be stuck to the adhesive face.

A portion of each of the first inner edges of the band 12 overlaps a portion of one of the outer edges of the tape 15 and a portion of each of the second inner edges of the band 12 overlaps a portion of the other of the outer edges of the tape 15, with the overlapping portions of the tape 15 being on the overlapping portions 16 of the band 12 whereby the tape 15 is supported by the band 12.

The projecting portions extend from the band 12 to the face of the tape 15 that opposes the adhesive face of the tape 15. The overlapping portions include tapering portions.

The band 12 includes an engagement mechanism for controlling movement of the band 12. The engagement mechanism for controlling movement of the band 12 includes sprocket holes 13 running along one of the outer edges of the band 12. The band 12 is generally flat when unrolled from a reel.

The band 12 further comprises a plurality of offset sections 17, with each of the offset sections 17 surrounding one of the openings 14 and having one pair of inner edges, with each of the offset sections being offset relative to other sections of the band 12 and offset in the thickness direction of the band 12 such that electronic parts A having extensions B may be better engaged to the adhesive face of the tape 15 at said openings 14. The offset section 17 includes a pair of side panel portions, with each of the side panel portions running in the length direction of the band 12 and being formed in a quadrilateral shape. The offset section 17 includes a pair of end panel portions, with each of the end panel portions running in the width direction of the band 12 and being formed in a quadrilateral shape.

In FIG. 3 (A), carrier 11 includes a pair of overlapping portions 16 disposed at each of the first inner edges and includes another pair of overlapping portions 16 disposed at each of the second inner edges. The overlapping portions 16 include undulating portions. In FIG. 3 (B), opening 14 includes a length extending in the length direction of the band 12, wherein said overlapping portion 16 includes a length extending in the length direction of the band 12, and wherein the length of the overlapping portion 16 is substantially the same as the length of the opening 14. Each of the inner edges of the band 12 includes rounded edge portions, with the rounded edge portions being spaced from the outer edges of the tape 15. As shown in FIG. 3 (A), offset section 17 is integral with band 12.

Various details of the invention may be changed without departing from its spirit not its scope. Furthermore, the foregoing description of the preferred embodiments according to the present invention is provided for the purpose of illustration only, and not for the purpose of limiting the invention as defined by the appended claims and their equivalents.

What is claimed is:

1. A carrier for electronic parts, comprising:
   a) a band comprising:
      i) a length and a length direction, a width and a width direction, and a thickness and a thickness direction;
      ii) a pair of faces running the length of the band;
      iii) a pair of outer edges running the length of the band;
      iv) a set of openings running in the length direction and being spaced from the outer edges of the band, with each of the openings being spaced from each other;
      v) a plurality of pairs of first and second inner edges formed by the openings, with each of the first inner edges being paired with one of the second inner edges of the band, with the first and second inner edges of each of the pairs being across from each other in the width direction of the band;
   b) a tape extending in the length direction of the band and comprising:
      i) a length and a length direction, a width and a width direction, and a thickness and a thickness direction;
      ii) a pair of outer edges running the length of the tape, with one of the outer edges of the tape confronting the first inner edges of the band and with the other of the outer edges of the tape confronting the second inner edges of the band;
      iii) a pair of opposing faces, with one of the faces comprising an adhesive face, with some sections of the adhesive face adhering to one of the faces of the band, with other sections of the adhesive face being exposed by the openings of the band such that electronic parts can be stuck to the adhesive face; and
   c) wherein a portion of each of the first inner edges of the band overlaps a portion of one of the outer edges of the tape and wherein a portion of each of the second inner edges of the band overlaps a portion of the other of the outer edges of the tape, with the portion of the tape which overlaps being on the portion of the band which overlaps whereby the tape is supported by the band.

2. The carrier according to claim 1 wherein the portion of the band which overlaps extends from the band to the face of the tape that opposes the adhesive face of the tape.

3. The carrier according to claim 1 wherein the portion of the band which overlaps comprises a tapering portion.

4. The carrier according to claim 1 wherein the band comprises an engagement mechanism for controlling movement of the band.

5. The carrier according to claim 4 wherein the engagement mechanism for controlling movement of the band comprises sprocket holes running along at least one of the outer edges of the band.

6. The carrier according to claim 1 wherein the band is generally flat when unrolled from a reel.

7. The carrier according to claim 1 wherein the band further comprises a plurality of offset sections, with each of the offset sections being integral with the band, with each of the offset sections surrounding one of the openings and having one pair of inner edges, with each of the offset sections being offset relative to other sections of the band and offset in the thickness direction of the band such that electronic parts having extensions may be better engaged to the adhesive face of the tape at said openings.

8. The carrier according to claim 7 wherein said offset section comprises a pair of side panel portions, with each of the side panel portions running in the length direction of the band and being formed in a quadrilateral shape.

9. The carrier according to claim 7 wherein said offset section comprises a pair of end panel portions, with each of the end panel portions running in the width direction of the band and being formed in a quadrilateral shape.

10. The carrier according to claim 3 wherein said portion of the band which overlaps at each of the first inner edges comprises a protecting portion and another projecting portion and wherein said portion of the band which overlaps at each of the second inner edges comprises a protecting portion and another projecting portion.

11. The carrier according to claim 1 wherein the portion of the band that overlaps comprises an undulating portion.

12. The carrier according to claim 1 wherein said opening includes a length extending in the length direction of the band, wherein the portion of the band which overlaps includes a length extending in the length direction of the band, and wherein the length of the portion of the band which overlaps is substantially the same as the length of the opening.

13. The carrier according to claim 1 wherein each of the inner edges comprises rounded edge portions, with the rounded edge portions being spaced from the outer edges of the tape.

* * * * *